United States Patent [19]

Billings et al.

[11] 4,245,184
[45] Jan. 13, 1981

[54] AC SOLID-STATE CIRCUIT BREAKER

[75] Inventors: William W. Billings, Cridersville; Richard E. Luebrecht, Wapakoneta, both of Ohio

[73] Assignee: Westinghouse Electric Corp., Pittsburgh, Pa.

[21] Appl. No.: 23,361

[22] Filed: Mar. 23, 1979

[51] Int. Cl.³ ............................................. G05F 3/04
[52] U.S. Cl. ................................ 323/235; 323/241; 323/244; 361/3; 361/93; 323/277
[58] Field of Search .................. 307/252 T, 252 UA; 323/9, 18, 19, 24; 361/3-7, 93, 100

[56] References Cited

U.S. PATENT DOCUMENTS

| | | | |
|---|---|---|---|
| 3,555,292 | 1/1971 | Henry | 361/6 |
| 3,557,381 | 1/1971 | Henry | 361/6 |
| 3,879,652 | 4/1975 | Billings | 323/22 SC |
| 3,914,625 | 10/1975 | Billings et al. | 307/252 UA |
| 3,925,688 | 12/1975 | Kalfus | 323/18 X |
| 4,059,849 | 11/1977 | Mitchell | 361/395 |

*Primary Examiner*—A. D. Pellinen
*Attorney, Agent, or Firm*—G. H. Telfer

[57] ABSTRACT

A solid-state circuit breaker is provided with circuitry for permitting off/on/reset operations actuated by a mechanical toggle control switch for close simulation of magnetic circuit breaker operation. A power continuity feature is provided for load power by locating the control switch so that it opens all of the circuit, except the static power switch branch, between the source and the load, to provide a high degree of fail-safe protection for the apparatus. The power continuity feature includes means for zero crossover synchronization both upon power-up and power-down conditions. A circuit lockout feature is used so that on power-up or turn-on, operation is delayed until the occurrence of an internal power-ready condition. On power-down or turn-off, there is means for circuit retention subsequent to switch opening and internal power removal in order to accomplish load turn-off at a desired zero crossover point of the load power through the power switch. A power supply is incorporated that does not require stepdown or isolation transformers and improves capability for miniaturization of the overall circuitry and enables design of the circuit for operation at any of a wide range of frequencies.

6 Claims, 3 Drawing Figures

AC SOLID-STATE CIRCUIT BREAKER

BACKGROUND AND SUMMARY OF THE INVENTION

This invention relates to solid-state circuit breakers for controlling the supply of power from an AC supply to a load and particularly to such circuit breakers that are suitable for applications in which size and weight must be minimized and reliability must be maximized while closely simulating the functions of conventional electromechanical apparatus.

In Billings U.S. Pat. No. 3,879,652, Apr. 22, 1975, there was disclosed an AC solid-state power controller, which disclosure is incorporated herein by reference. Such apparatus is quite satisfactory for its intended purposes. The denomination of such apparatus as a "power controller" could also be applied to that of the present invention. However, it is instead chosen to refer to the present apparatus as a solid-state "circuit breaker" to convey the suggestion that the apparatus has capability for interruption in response to a manually actuated element or switch, as an electromechanical circuit breaker does, in addition to the internal power control functions therein.

The off/on/reset toggle switch of conventional circuit breakers utilizing magnetic and thermally responsive elements is a desirable feature and affords flexibility and convenience in the testing, maintenance and use of the breaker. Additionally, electromechanical breakers have the quality of power contact, meaning that the closed or on position provides direct conduction of power to the load with negligible impedance and upon interruption there is a clean break imposing an infinite impedance in the load circuit. Such apparatus is also capable of inverse trip time overload protection, that is, it can be made responsive in a shorter time to a higher overload condition than a smaller overload condition. Also, conventional circuit breakers can readily be provided with means for status indication of the contacts. All these functions are desirably to be achieved in a solid-state circuit breaker which avoids problems of mechanical wear, reliability, and bulk.

Among the qualities not provided by conventional type circuit breakers is any means for insuring occurrence of the closing or interruption function in accordance with a predetermined point in the applied power wave form. Such synchronism becomes an important objective in achieving a solid-state circuit breaker because the power switch elements, normally thyristors, are, in contrast with mechanical contacts, peculiarly dependent in their operation and performance on the applied wave shape.

Also, conventional circuit breakers inherently exhibit overload protection within a wide tolerance range which is desirably to be made more precise.

Other qualities of conventional circuit breakers tending to make them unattractive in high reliability situations is that they are affected by ambient temperature, dust, moisture, and the like, and exhibit relatively low physical strength and endurance to shock and vibration.

The general purposes of the apparatus of the present invention are to provide a solid-state circuit breaker with the good qualities of electromechanical circuit breakers while markedly improving on the poorer qualities so that the apparatus is capable of performance with high reliability in a compact and low weight structure making it particularly suitable for use in aerospace, military and oher applications where these performance advantages are desirable.

In accordance with the present invention, a solid-state circuit breaker is provided with circuitry for permitting off/on/reset operations actuated by a mechanical toggle control switch for close simulation of magnetic circuit breaker operation. Locating the control switch so that it opens essentially all of the circuitry except for the static power switch branch, between the source and the load, provides a high degree of fail-safe protection for the apparatus, or a power removal feature. A power continuity feature includes means for zero crossover synchronization both upon power-up and power-down conditions with full sine wave conduction through the static power switch regardless of the instant at which the manual control switch is opened or closed. A circuit lockout feature is used so that on power-up, or turn-on, operation is delayed until the occurrence of an internal power-ready condition. On power-down, or turn-off, there is means for circuit retention subsequent to switch opening and internal power removal in order to accomplish load turn-off at a desired zero crossover point of the load power through the power switch. A power supply is incorporated that does not require stepdown or isolation transformers and improves capability for miniaturization of the overall circuitry and enables design of the circuit for operation at any of a wide range of frequencies, such as 60 Hz to 400 Hz.

The invention is generally an improvement on the "power controllers" such as that of U.S. Pat. No. 3,879,652 in order to achieve additional "circuit breaker" functions.

DESCRIPTION OF THE PREFERRED EMBODIMENTS

Figure 1:
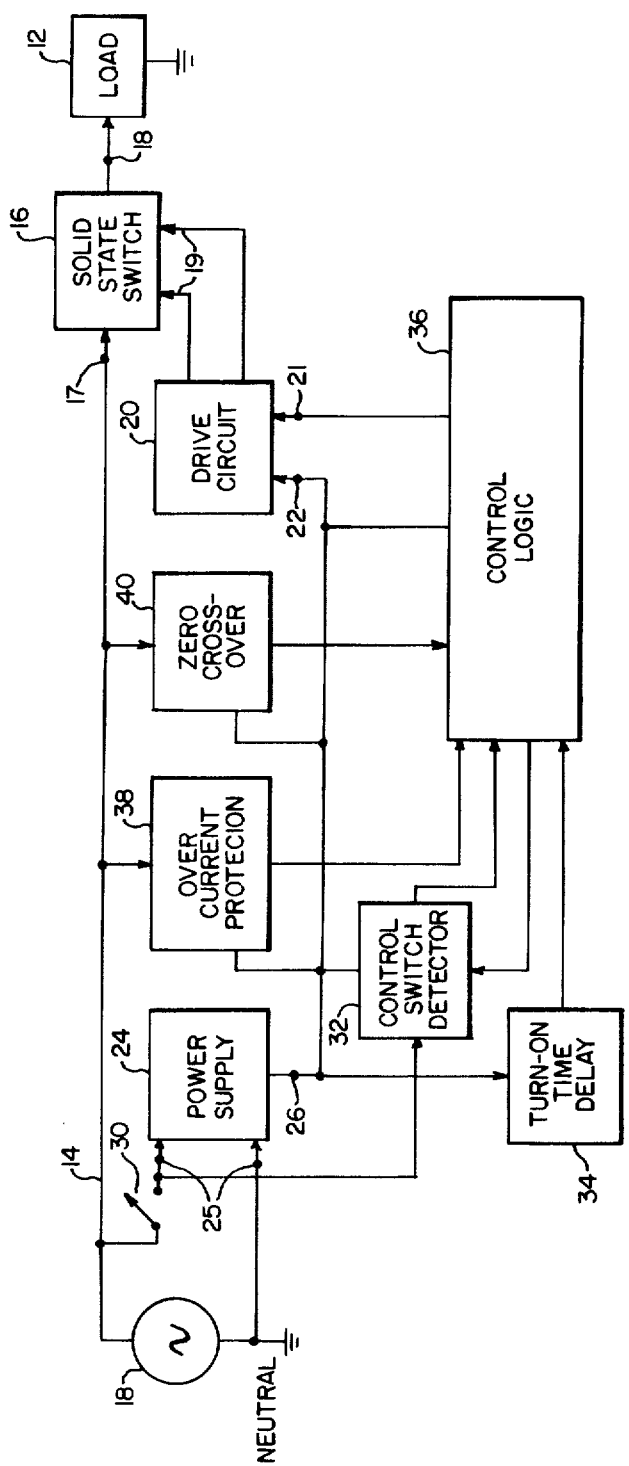
FIG. 1 is a functional block diagram of apparatus in accordance with an embodiment of the present invention.

Referring to FIG. 1, a solid-state circuit breaker is illustrated, in a one-line diagram, for controlling the supply of power from an AC supply 10 to a load 12 on an AC line 14. A solid-state switch 16, sometimes referred to as a static power switch or the like, has supply and load terminals 17 and 18 connected respectively to the supply 10 and load 12 and also has drive terminals 19 for the selective application of predetermined drive signals to alter the conduction state of the switch.

Various switch configurations may be employed in the practice of this invention. A switch principally comprising a pair of inverse parallel thyristors is presently preferred. The power switch portion of the circuit may also include rectifier and filter elements, see FIG. 2.

Figure 2:
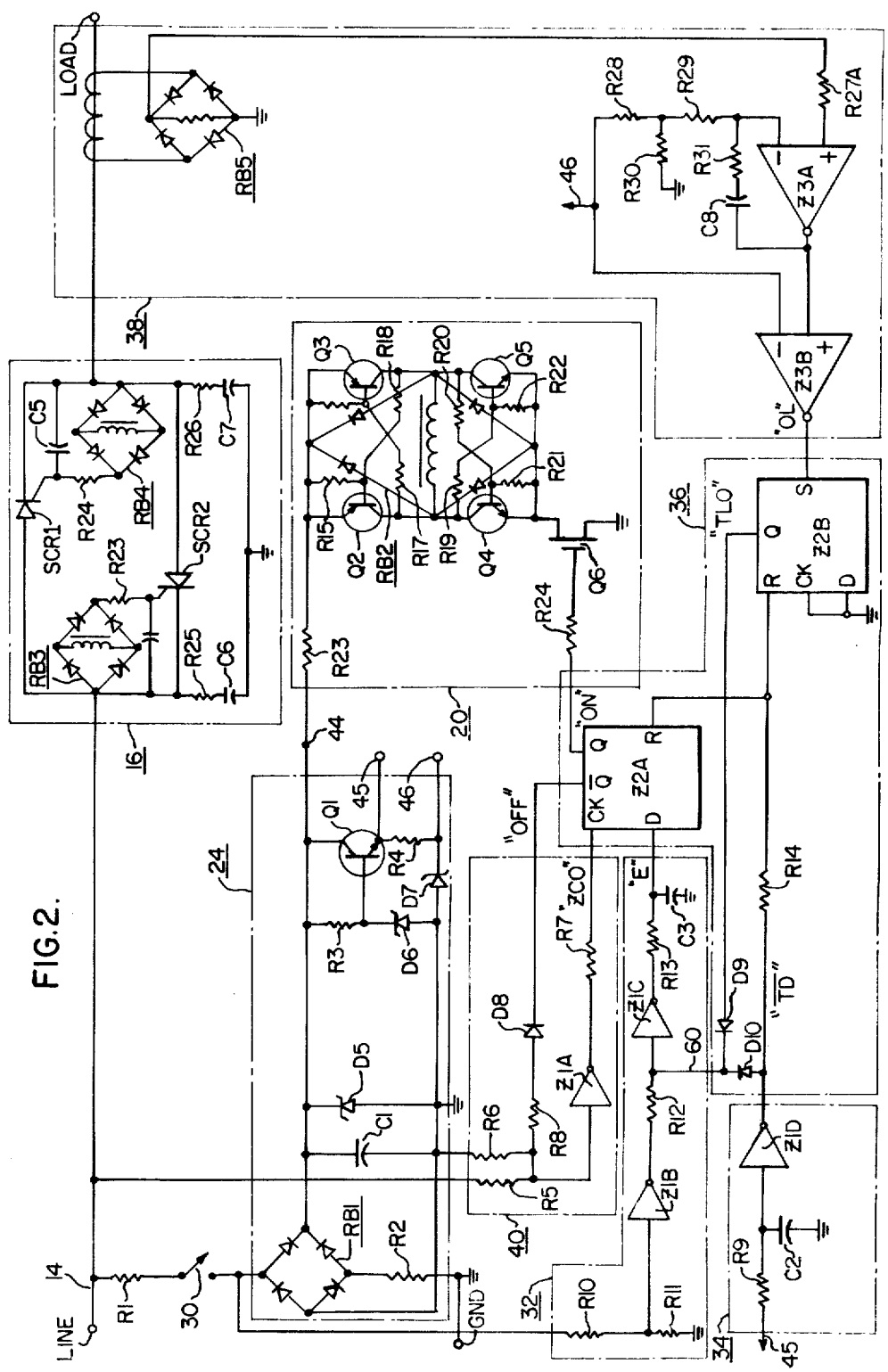
FIG. 2 is a detailed circuit schematic of an embodiment of this invention.

A drive circuit 20 is provided for applying drive signals to the power switch 16. The drive circuit 20 is shown having output terminals electrically coupled to the drive terminals 19 of the power switch 16, as well as a control input terminal 21 for receiving control signals to which it responds as well as a power supply terminal 22, but it is to be understood this representation is for generally descriptive purposes rather than precise definition of which elements fall within which circuit block. For example, the circuit for the power switch 16 and the drive circuit 20 in the preferred embodiment of FIG. 2 is such that the relation of the two is inductive rather than by direct electrical connection.

A power supply circuit 24 is provided that has input terminals 25 for connection to the AC supply, through a manual control switch 30, and to a reference potential (ground or neutral) and also has an output terminal 26 connected to the drive circuit 20 as well as to other circuit portions. The power supply circuit 24 comprises elements for the conversion of AC power to DC power with whatever filtering and regulation is desirable. It is to be noted that the apparatus of the present invention preserves the quality of the apparatus of U.S. Pat. No. 3,879,652 that permits the various circuits to be powered merely from the AC line without requiring any separate DC power supply unassociated with the line. Thus, this apparatus may also be referred to as "self-powered" or "self-energized."

The control switch 30 between the line 14 and the power supply 24 enables total deenergization of the circuit breaker, except for the solid-state switch 16 and except for the zero crossover circuit 40, to provide a highly reliable means of removing load power.

There is provided a means for detecting the closing of the control switch 30, shown in FIG. 1 as a control switch detector circuit 32. There is also a turn-on time delay circuit 34 to insure that upon the control switch 30 being closed the power supply 24 can reach a voltage level adequate to continuously operate.

Signals from the control switch detector 32 and the turn-on time delay 34 are supplied to a control logic circuit portion 36. The control logic circuit 36 provides signals to the drive circuit 20 and is responsive, besides to the control switch detector 32 and time delay 34 circuits, to other detected conditions of the apparatus by means of an overcurrent protection circuit 38 and a zero crossover circuit 40.

The zero crossover circuit 40 is to permit accurate turn-on and turn-off synchronization for the circuit breaker with respect to the AC supply voltage waveform and preferred forms of such zero crossover circuit will be described hereinafter. The zero crossover circuit 40, control switch detector 32, and turn-on time delay 34 are significant in enabling the desired circuit breaker performance from the apparatus of this invention.

The overload protection circuit provides inverse type overload tripping in the event of excessive loads or load faults.

In contrast to the apparatus of prior U.S. Pat. No. 3,879,652, the apparatus of FIG. 1 differs in the provision of the control switch 30 for manual toggling of the circuit breaker and the control switch detector 32 and turn-on time delay 34 which together with the zero crossover circuit 40 provide a signal to insure correct operation of the drive circuit 20 for the solid-state switch 16 in accordance with the voltage supply wave form.

An additional function that can be provided in accordance with the skill of the art, although not illustrated, is an indication function to indicate closure of the circuit breaker in either the "on" or "tripped" condition or to indicate the "off" condition.

The nature and operation of circuit breakers in accordance with this invention will be better understood by reference of FIG. 2 which shows a more specific embodiment in accordance with this invention although the circuit may be modified in accordance with known practice from the principles here presented. Control switch 30 is connected between the line 14 and the power supply 24 with a voltage dropping resistor R1 between it and the line. In the power supply 24, the AC line voltage is rectified by a full wave rectifier bridge RB1. Dropping resistor R2, connected between the bridge and the ground or neutral lead, and R1 provide both voltage limiting for the power supply and a measure of immunity against circuit breaker misconnections. Capacitor C1 filters the rectified voltage from the bridge and zener diode D5 limits the +DC voltage at point 44 in the tripped state and under severe overvoltage transient conditions. Resistors R3 and R4, zener diodes D6 and D7, and transistor Q1, connected as shown, provide lower, regulated, DC voltage levels at output terminals 45 and 46 for other circuit portions to be described. The higher +DC voltage at 44 is supplied on a line to the drive circuit 20 to be described subsequently.

As can be readily seen, the power supply 24 and the other circuit portions dependent on it are totally deenergized when the control switch 30 is in the open position. This provides a highly reliable means of removing load power for circuit breaker functioning.

The zero crossover circuit 40 has resistor R5 directly connecting it to the line 14 and resistor R6 connecting it to the power supply 24 at ground. Amplifier element Z1A, having its input connected to R5, provides an amplified zero crossover signal or "ZCO" signal through resistor R7 to the control logic circuit 36. In the line connecting the common terminal of R5 and R6 with the "OFF" signal of the control logic circuit 36 is resistor R8 and diode D8 for providing a bias for the "ZCO" signal. A purpose of the zero crossover circuit 40 is to provide accurate turn-on and turn-off synchronization for the solid-state circuit breaker with respect to an AC supply voltage zero crossover. This circuit senses the line-to-ground voltage and generates a quasi-square wave whose positive rising edges define zero crossover operating times that coincide with the 180° zero crossings of the AC source voltage.

Figure 3:
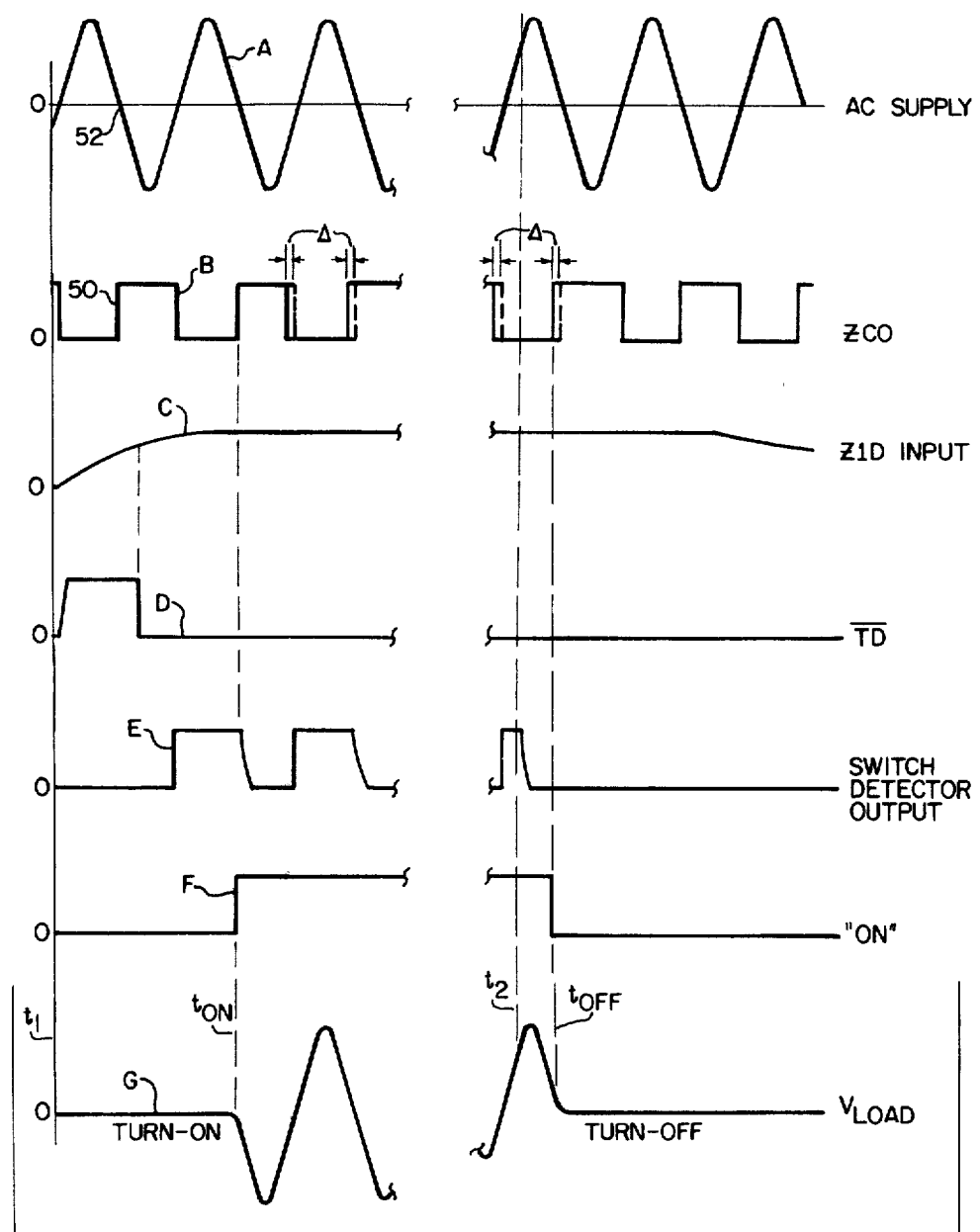
FIG. 3 is a set of waveforms illustrative of the operation of apparatus in accordance with this invention.

In FIG. 3, curve A shows the AC supply voltage waveform and curve B shows the zero crossover signal ZCO from which it can be seen that each rising edge of the zero crossover signal, such as 50, occurs when the supply voltage is crossing zero from plus to minus, at 52. In apparatus in accordance with this invention, it is advantageous to utilize the negative going zero crossover point (the 180° crossover) for the zero crossover signal. This selection is made in order to attain the power continuity feature which reduces turn-on saturation and transients particularly when the breaker is used in an electromagnetic load circuit. Reference is made to Billings and Tipton U.S. Pat. No. 3,914,625, Oct. 21, 1975, for further description of desirable characteristics of zero crossover circuits in solid-state power control apparatus.

It is particularly to be noted that the AC input signal to the zero crossover circuit 40 through R5 is independent of the control switch 30 being closed so that on turn-off proper synchronization with the 180° zero crossover point will be maintained. There is also deliberate early occurrence of the zero crossover signal positive leading edge obtained in the ON state to preclude extra half-cycle load power by leading power factor load currents. This latter function is accomplished by loading the zero crossover input sensing node in the ON state by R8 and D8 to the OFF signal which is low when the circuit breaker is ON.

In FIG. 3, waveform B, the occurrence of the shift in ZCO in the ON state is shown by the Δ symbol. For the circuit of the specific embodiment of FIG. 2, Δ equals about 18°.

The turn-on time delay circuit 34, which might also be called a "power ready" circuit, has an RC charging circuit portion comprising resistor R9 and capacitor C2 between the power supply point 45 and logic element Z1D whose output is supplied to the control logic circuit 36. The turn-on time delay circuit 34 generates inhibiting and reset logic signals subsequent to the closing of the control switch. These signals keep the circuit breaker in the OFF state until the power supply has reached a voltage level adequate to continuously operate. The inhibiting signals are used to preset both sections Z2A and Z2B of dual flip-flop 22 in the control logic circuit 36 to the OFF state. In practice, the time delay afforded is quite short, such as 15 milliseconds, to permit reaching the threshold level of Z1D in that time and to cause it to go from logical one to a zero output state. Wave forms C and D of FIG. 3 show, respectively, the time delay sensing signal at the input of Z1D and the logic signal of $\overline{TD}$.

The switch detector circuit portion 32 includes resistors R10 and R11 connected between the control switch 30 and ground. The point between those resistors is connected to the input of Z1B whose output is connected through resistor R12 to Z1C, resistor R13 and subsequently to a terminal of the control logic circuit 36. Capacitor C3 is connected between the output of the detector circuit 32 and ground. The input of Z1C is also connected directly to a part of the control logic circuit 32 on line 60.

The switch detector circuit 32 provides a logic signal that turns the circuit breaker on and off in response to the control switch 30. The output signal that is generated, shown in curve E of FIG. 3, is a quasisquare wave rather than a continuous "on" signal. This pulsating signal is obtained whenever the control switch 30 is closed and is generated in a manner similar to that of the zero crossover signal but is inverted by an additional logic gate element, Z1C, and time delayed by R13 and C3 so that the control signal "E" generated always is positive at the instant the zero crossover signal is produced, as long as the control switch is closed, other than during the turn-on time delay period.

In the control logic circuit portion 36, the main logic elements are the two parts of a dual D flip-flop, Z2A and Z2B. Z2A provides the OFF signal to the zero crossover circuit from terminal $\overline{Q}$; it receives the zero crossover signal "ZCO" at terminal CK from the zero crossover circuit; it receives the switch detector output signal "E" at its terminal D and its terminal R receives the TD signal and is directly connected to terminal R of Z2B. A line from the turn-on time delay circuit 34 is connected through resistor R14 to terminal R of Z2B. There is also a connection from terminal Q of Z2B through diode D9 at a point common with the input to Z1C in the switch detector circuit. Also, that point is connected through diode D10 to the output of the turn-on time delay circuit. Z2B has a further input at terminal S from the overload protection circuit, to be described. The terminals CK and D of Z2B are connected together and to ground.

The control logic circuit produces an ON signal from terminal Q of Z2A for the drive circuit 20 upon occurrence of the correct sequence of events. In FIG. 3, part F shows the ON signal and how it correlates with the various other logic and AC signals.

In operation, when the control switch 30 is opened, the control signal "E" from the switch detector disappears so that the circuit breaker will shut-off at the next zero crossover operating time. This manner of shutoff provides two significant features, namely that it is proper for load power continuity and also that it occurs in a maximum time of one cycle from control switch opening so as to assure adequate energy is available in the power supply to maintain energization for the various circuit breaker circuits.

The drive circuit 20 principally includes a Royer-type square wave oscillator comprising transistors Q2, Q3, Q4, and Q5 in a bridge configuration within which is arranged a rectifier bridge RB2 with resistors R15 through R22 connected as shown. The drive circuit 20 gets its supply from the high +DC voltage from the power supply through resistor R23 and also gets an ON signal through resistor R24 from the control logic circuit 36. R24 is connected to the input of a field effect transistor Q6. connected with the transistor bridge elements Q4 and Q5. Across the transistor and diode bridges of the drive circuit is the primary winding of transformer T1 whose secondary windings are within the power switch circuit portion 16 as will be described.

The function of the drive circuit 20 is to amplify the "ON" signal and provide two electrically isolated thyristor gate signals for the static power switch 16. The drive circuit uses a Royer square wave oscillator with its transistors connected in a bridge configuration rather than a conventional center-tapped configuration. This allows the use of a single primary winding for transformer T1 instead of a two-section winding, with a consequent 50% reduction in number of turns, and the collector-to-emitter voltage rating of the transistors is half that required of a center-tapped circuit, which would require the use of higher voltage devices.

In the static power switch 16 the main switch elements are SCR1 and SCR2 connected in inverse parallel configuration directly in the load circuit. The SCR gate terminals are connected to respective diode bridges RB3 and RB4 across each of which a separate secondary winding of the transformer T1 is connected so that the signal from these windings is applied to the gates through respective resistors R23 and R24. There are also shown capacitors C4 and C5 connected respectively with the gates of SCR2 and SCR1. Each side of the power switch 16 is connected to ground through respective resistors R25 and R26 and capacitors C6 and C7.

The SCR's provide a full cycle conduction path for load current and are controlled by their gate signals in a timewise fashion to assure operating at the 180° crossover point of the AC power source. Filtering and bypassing are provided by the capacitors C4 and C5 and the input and output snubbers comprising respectively R25 and C6 and R26 and C7.

The overload protection circuit 38 has current transformer CT associated with the line on the load side of the power switch 16 that gets a signal that is rectified by bridge RB5 across which is connected resistor R27. The signal produced by the current transformer and bridge is supplied through R27A to an input of operational amplifier element Z3A whose output is connected to an input of operational amplifier element Z3B. The overload protection circuit receives low voltage DC at point 46 from the power supply as a reference so that elements R28 through R31 and capacitor C8 cooperate to sense, integrate and compare the sensed overload signal to provide an overload trip signal OL at the output of Z3B applied to the control logic circuit, which sets the trip lockout, TLO, flip-flop signal utilized in the control logic circuit 36. The trip lockout signal TLO in turn causes the removal of the control signal from the switch detector 32 so as to effect circuit breaker shutoff.

As an alternative to the illustrated overload protection circuit 38, there may be used a precision rectifier operation amplifier circuit that may be designed to reduce the size of the current transformer at the expense of some additional circuit complexity.

If an indication function were to be obtained in the illustrated circuit, closure would be indicated simply by adding a third secondary winding to T1 to obtain a base drive signal for a transistor which would be conducting in the circuit breaker ON state and nonconducting in the OFF state. An optional means would be to use optical isolator techniques. Also a circuit breaker TRIP condition could be indicated in addition to or instead of the ON state condition.

The waveforms and sequences illustrated in FIG. 3 are believed particularly instructive of the manner of operation of the circuitry in accordance with this invention. It is assumed that the control switch 30 is open and the circuit breaker is OFF prior to time $t_1$. At $t_1$ it is assumed the manual control switch 30 is closed and that it remains closed until time $t_2$ at which time it is opened. In an initial period between $t_1$ and $t_{ON}$ the load voltage illustrated in curve G remains zero. However, the zero crossover signal, curve B, is generated and the time delay sensing signal, curve C, builds up gradually up over a first interval to a point at which TD is terminated as shown in curve D. Following occurrence of the TD signal, the switch detector output signal, curve E, occurs in coordination with the zero crossover signal ZCO. At the instant $t_{ON}$ when there is a positive switch detector signal "E" and the correct (i.e.: positive rising edge, 50) zero crossover signal there is an ON signal, curve F, produced to the drive circuit that turns on the load voltage. This voltage will continue to be ON until both the opening of the manual control switch at time $t_2$ and the occurrence of the change of state of the ON signal in coincidence with the next correct zero crossover signal.

The following components are identified by way of example for a specific operable embodiment that was built and verified the circuit design with the following characteristics:

| PERFORMANCE TABLE | |
| --- | --- |
| Nominal Rating | 120 VRMS/20 Amperes |
| Temperature Ambient Range Tested | −25° C. to 75° C. |
| AC Source Voltage Range | 89 VRMS to 135 VRMS |
| AC Source Frequencies | 60 Hz and 400 Hz |
| SSCB Dissipation/Efficiency at Rated Load | 28.2 W/98.9% |
| "Off" State Dissipation | .01 W* |
| "Tripped" State Dissipation | 2.3 W* |
| *Includes power switch leakage dissipation | |
| D.C. Power Supply levels: | |
| +DC, at point 44 | +60 V (ON state) |
| at point 45 | +12 V |
| at point 46 | +6.4 V |

| COMPONENT TABLE | | | |
| --- | --- | --- | --- |
| R1,R2 | 1,000 | ohms | each |
| R3 | 100,000 | " | |
| R4,R15,R16,R21,R22 | 5,000 | " | each |
| R5,R7,R11,R12,R14 | 500,000 | " | each |
| R6 | 250,000 | " | |
| R8,R13 | 50,000 | " | each |
| R9 | 357,000 | " | |
| R10 | 1 Meg | " | |
| R17,R18,R19,R20 | 62,000 | " | each |
| R23,R24 | 22 | " | each |
| R25,R26 | 47 | " | each |
| R27 | 2.5 | " | |
| R27A,R29 | 174,000 | " | each |
| R28 | 30,100 | " | |
| R30 | 603 | " | |
| R31 | 97,600 | " | |
| C1 | 10 | mf. | |
| C2,C8 | 0.05 | " | each |
| C3,C6,C7 | 0.01 | " | each |
| C4,C5 | 0.068 | " | each |
| RB1,RB2,RB3,RB4,RB5 | VE 18 X each | | |
| Q1,Q4,Q5 | 2N3019 | | each |
| Q2,Q3 | 2N5679 | | each |
| Q6 | 2N6660 | | |
| Z1A,Z1B,Z1C and Z1D | Sections of MC14584B Hexagonal Schmitt trigger (CMOS) | | |
| Z2A and Z2B | Sections of MC14013B Dual "D" Flip-Flop (CMOS) | | |
| Z3A and Z3B | Sections of LM124 Quad op amp | | |
| SCR1 and SCR2 | 2N3898 | each | |

The apparatus in accordance with this invention has been therefore confirmed to operate satisfactorily for the intended purposes as a solid-state circuit breaker and is further characterized by features permitting miniaturization, compactness and reliability as desired. While the particular form in which the packaging of the circuitry takes is incidental to the practice of this invention, it may for example be assembled, enclosed, and interconnected using techniques in accordance with Mitchell U.S. Pat. No. 4,059,849, Nov. 22, 1977.

Aspects of the present invention have also been applied in solid-state circuit breakers for use in multiphase power systems as is disclosed in copending application Ser. No. 023,368, filed Mar. 23, 1977, by Mitchell and Billings and assigned to the present assignee.

We claim:

1. A solid-state circuit breaker for alternating current applications comprising:
 a static power switch for connection between an AC voltage supply and a load;
 power supply means for developing DC voltage from the applied AC voltage supply;
 a manually operable control switch connected between the supply line and said power supply means;
 zero crossover circuit means with connections both with said supply line directly and with said supply line only through said control switch and said power supply means for producing a first signal indicative of the zero crossover of the AC voltage supply;
 turn-on time delay circuit means for producing a signal indicative of the power supply means having achieved full operating capability after the closing of said control switch;
 switch detector circuit means for producing a signal in response both to the closing of said control switch and the occurrence of said time delay signal;

control logic means for responding to the occurrence of said signals in a manner to produce an ON signal only when said zero crossover signal occurs and said switch detector signal occurs;

drive circuit means responsive to said ON signal of said control logic means for application of signals to said power switch to initiate conduction thereof.

2. A solid-state circuit breaker in accordance with claim 1 wherein: said zero crossover signal is a substantially square wave signal between a zero and a one state and the upward rising portion of said square wave occurs substantially with the occurrence of a negative going zero crossover of the AC supply voltage.

3. A solid-state circuit breaker in accordance with claim 2 wherein: said switch detector output signal is a substantially square wave whose pulses coincide with the occurrence of said upward zero crossover signal and cause the production of an ON signal at the first said zero crossover signal occurring after the closing of said control switch.

4. A solid-state circuit breaker in accordance with claim 1 further comprising:

overload protection circuit means responsive to an overload condition in said load circuit to produce a signal disabling said control logic from the production of an ON signal.

5. A solid-state circuit breaker in accordance with claim 2 wherein: said zero crossover signal coincides with the occurrence of said negative going zero crossover of the AC supply voltage except when said power switch is ON during which time said zero crossover signal occurs slightly prior to said negative going zero crossover of the AC supply voltage for providing positive turn-off insuring against extra half-cycle load power by leading power factor load current.

6. A solid-state circuit breaker in accordance with claim 1 wherein: said zero crossover circuit means produces said first signal independent of said power supply means and the state of said control switch; said power supply means includes energy storage means (C1) for maintaining an interval of operation upon opening of said manual control switch, and said switch detector circuit means responds to the opening of said control switch to terminate said switch detector signal within one-half cycle of the AC voltage supply, so as to cause said static power switch to be maintained in the ON state, following opening of said control switch, until the end of a full cycle of the AC voltage supply.

* * * * *